United States Patent [19]
Fukuda et al.

[11] Patent Number: 5,254,867
[45] Date of Patent: Oct. 19, 1993

[54] SEMICONDUCTOR DEVICES HAVING AN IMPROVED GATE

[75] Inventors: Sanae Fukuda; Naoyuki Shigyo, both of Yokohama, Japan

[73] Assignee: Kabushiki Kaisha Toshiba, Kawasaki, Japan

[21] Appl. No.: 726,764

[22] Filed: Jul. 8, 1991

[30] Foreign Application Priority Data

Jul. 9, 1990 [JP] Japan .................................. 2-179621
Sep. 28, 1990 [JP] Japan .................................. 2-256962

[51] Int. Cl.$^5$ ..................... H01L 29/78; H01L 29/06
[52] U.S. Cl. ..................... 257/411; 257/346
[58] Field of Search .............. 357/23.3, 23.9, 23.15, 357/54, 59 G; 257/440, 441, 324, 346

[56] References Cited

U.S. PATENT DOCUMENTS

| | | |
|---|---|---|
| 3,663,870 | 5/1972 | Tsutsumi et al. ............... 357/23.15 |
| 3,670,403 | 6/1972 | Lawrence et al. ............... 357/23.15 |
| 3,694,700 | 9/1972 | Low et al. ..................... 257/441 |
| 3,800,411 | 4/1974 | Abbink et al. . |
| 4,027,380 | 6/1977 | Deal et al. . |
| 4,062,040 | 12/1977 | Abbas et al. . |
| 4,169,270 | 9/1979 | Hayes . |
| 4,644,637 | 2/1987 | Temple . |
| 4,908,326 | 3/1990 | Ma et al. ....................... 357/23.3 |
| 5,034,798 | 7/1991 | Ohsima ......................... 357/23.15 |
| 5,119,152 | 6/1992 | Mizuno ......................... 357/23.3 |

FOREIGN PATENT DOCUMENTS

| | | |
|---|---|---|
| 66730A2 | 5/1982 | European Pat. Off. . |
| 98111A2 | 6/1983 | European Pat. Off. . |
| 2243674 | 4/1973 | Fed. Rep. of Germany . |
| 3431053A1 | 3/1985 | Fed. Rep. of Germany . |

OTHER PUBLICATIONS

"Technical Digest of International Electron Devices Meeting; p. 234, Si$_3$N$_4$/SiO$_2$ Spacer Induced High Reliability in LDDMOSFET and Its Simple Degradation Model"; T. Mizuno et al; 1988.

Primary Examiner—Gene M. Munson
Attorney, Agent, or Firm—Oblon, Spivak, McClelland, Maier & Neustadt

[57] ABSTRACT

A MOSFET comprises a silicon substrate 1 having a source/drain region 7b formed in a surface region thereof, an insulating film 3 formed of silicon oxide, and a gate electrode 4a. The side surface region of the electrode 4a is covered with an insulating film 6 formed of silicon nitride. The insulating film 6 has an extended portion interposed between the electrode 4a and the insulating film 3 in a manner to surround the lower corner portion 4b of the electrode. Since the insulating film 6 has a dielectric constant larger than that of the insulating film 3, it is possible to suppress the electric field intensity at the lower corner portion 4b of the electrode.

10 Claims, 13 Drawing Sheets

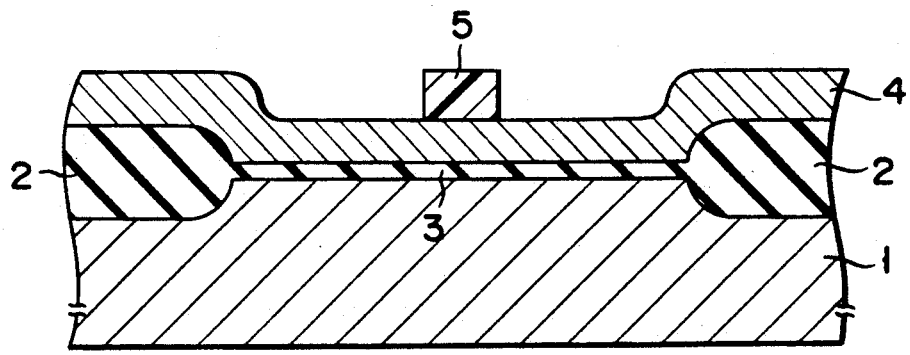
F I G. 2B
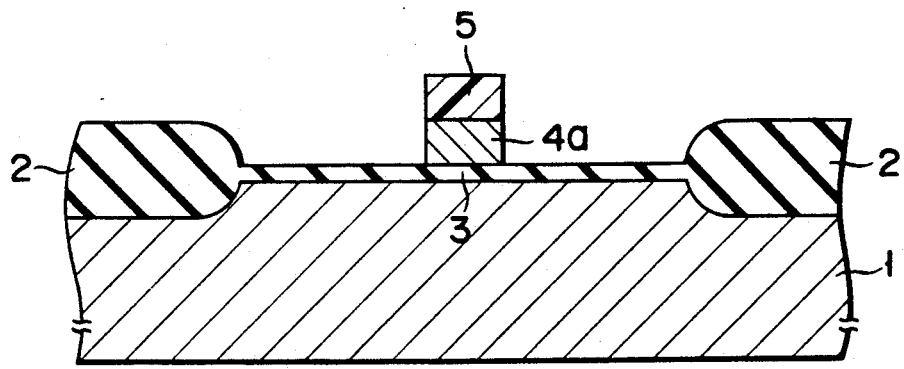
F I G. 2C
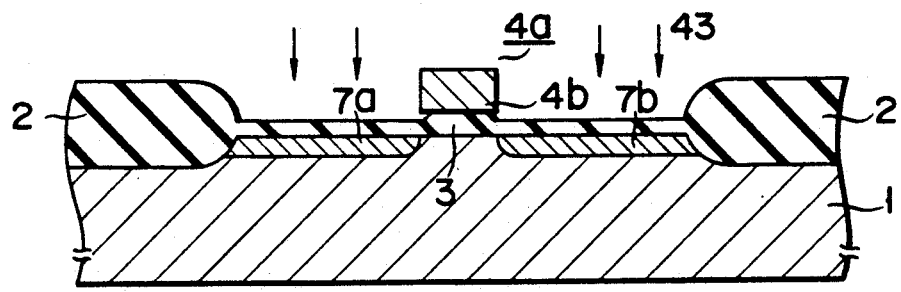
F I G. 2D

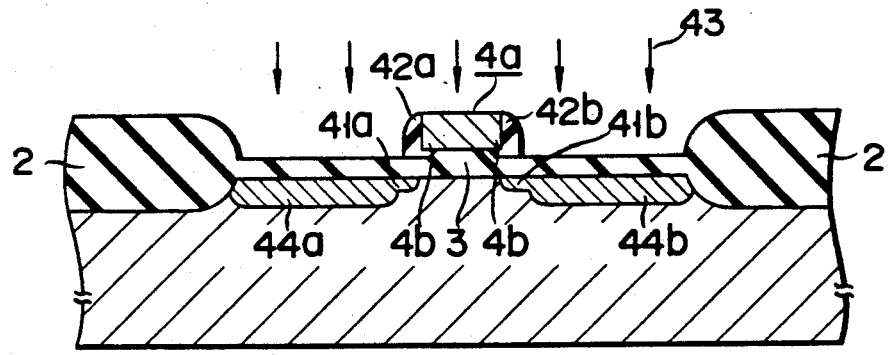
F I G. 4D
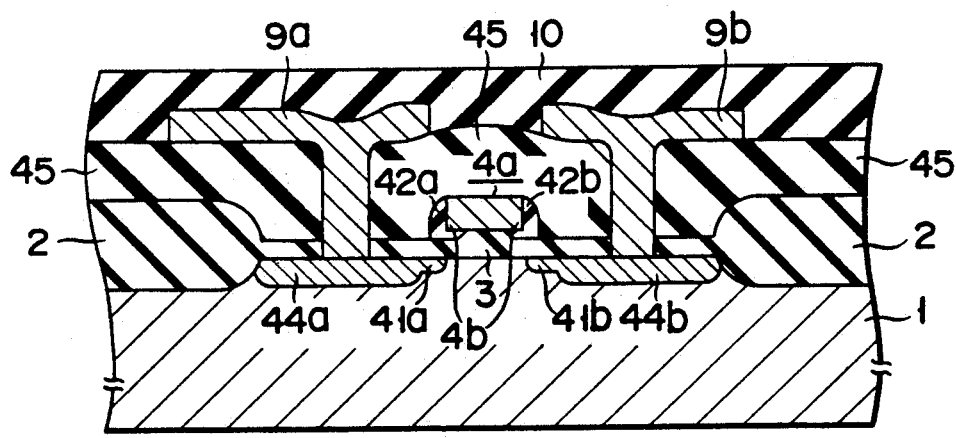
F I G. 4E

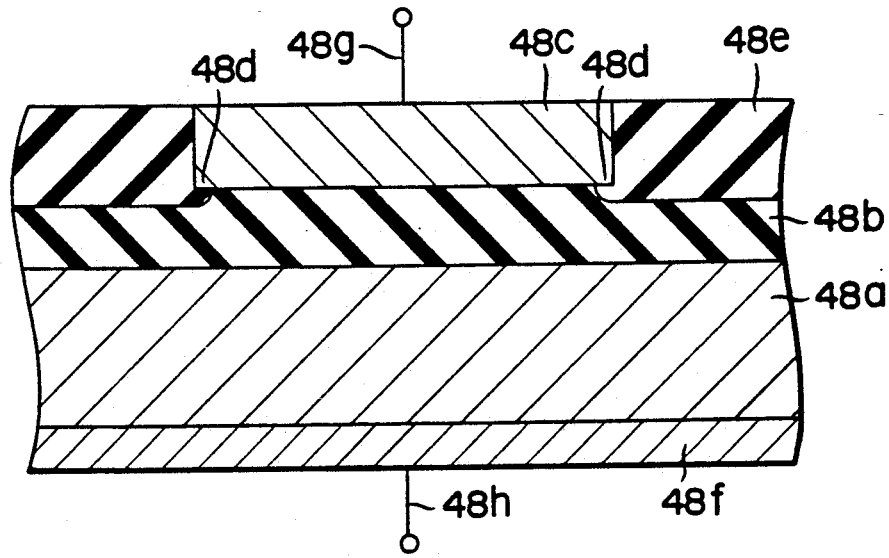
F I G. 5
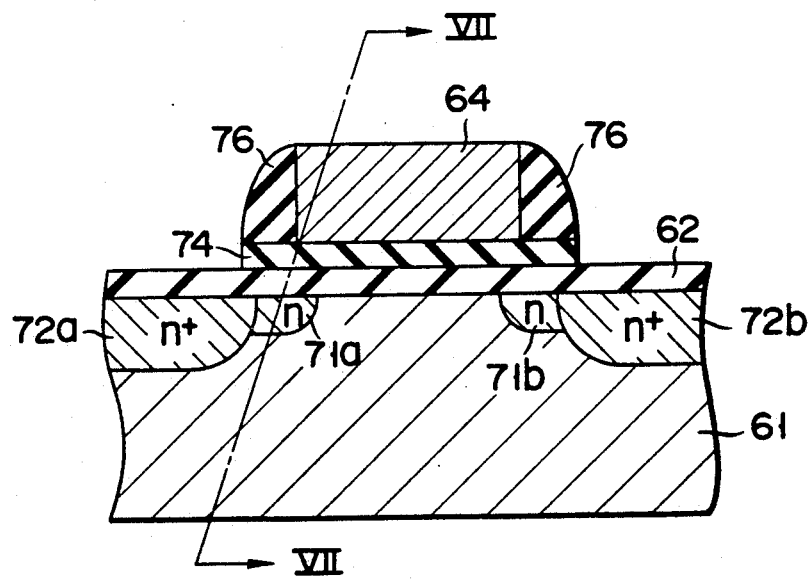
F I G. 6

SEMICONDUCTOR DEVICES HAVING AN IMPROVED GATE

BACKGROUND OF THE INVENTION

1. Field of the Invention

The present invention relates to a semiconductor device, particularly, to a MIS (Metal-Insulator-Semiconductor) type semiconduct device with an improved structure in the gate insulating film.

2. Description of the Related Art

In recent years, large scale integration (LSI) circuits are used in many cases in electronic computers, communication equipments, etc. the LSI is prepared by integrating a large number of transistors on a semiconductor substrate several millimeters square. The degree of integration has been further promoted recently for enabling LSI to perform many additional functions.

MIS type field effect transistors (MISFET) are main constituents of a silicon semiconductor integrated circuit of the most promoted degree of integration such as DRAM. FIG. 13 shows the general construction of, for example, an n-MISFET. As seen from the drawing, a gate electrode 154 consisting of a metal or a polycrystalline silicon is formed on a p-type silicon substrate 151 with an insulating film 153 consisting of, for example, silicon dioxide, interposed therebetween. Further, n-type source and drain regions 152a, 152b are formed in a substrate surface region such that the source and drain regions are positioned at the both sides of the region below the gate electrode. If voltage is applied to the gate electrode, an n-type channel is induced in the substrate surface region between the source and drain regions. At the same time, the current flowing through the channel is controlled by the voltage applied to the gate electrode. In order to promote the degree of integration and to achieve a high speed operation of the integrated circuit, miniaturization of the transistor constructed as shown in FIG. 13 is on a rapid progress. As a matter of fact, an element having an effective channel length of 0.1 micron has already been developed.

If the element is miniaturized on the basis of the scaling theory, which determines the shape of the element, the thickness of the gate insulating film 153 is rendered as small as at most 10 nm in the case where the gate length is set at 0.5 micron. Where the FET comprises such a thin gate insulating film, a high electric field is applied to the lower corner portions of the gate electrode 154 during the operation of the FET, leading to reduction in the breakdown voltage between the lower corner portions of the gate electrode 154 and each of the source and drain regions 152a, 152b, i.e., reduction in the gate breakdown voltage, and further to an insulation breakdown.

The arrows shown in FIG. 13 denote lines of electric force. The length of the arrow represents the intensity of the electric field. Needless to say, the longer arrow denotes the stronger electric field. As apparent from FIG. 13, electric field strength is particularly prominent in the lower corner portions of the gate electrode 154, with the result that current leakage tends to take place in the lower corner portions of the gate electrode 154 so as to bring about reduction in the gate breakdown voltage.

FIG. 14 illustrates a conventional measure for dealing with the difficulty noted above. As shown in the drawing, the gate oxide film 153 consisting of silicon dioxide is formed on the silicon substrate 151. Further, the gate electrode 154 consisting of polycrystalline silicon is formed on the gate oxide film 153. The element further comprises the drain region 152b and a channel region 152c. In the conventional technique, heating under an oxidizing atmosphere is applied after formation of the gate electrode 154 so as to cause growth of the oxide film below the lower corner portion of the gate electrode 154, i.e., to increase the thickness of the oxide film in a portion 153a. Needless to say, the thickness of the oxide film portion 153a is increased in an attempt to prevent the reduction in the gate breakdown voltage. In this technique, however, the thick portion of the oxide film 153 is positioned to reach a region below the central portion of the gate electrode in accordance with reduction in the gate length accompanying a further progress in the miniaturization of the element, with the result that the gate electrode fails to control as desired the potential of the channel region.

It should also be noted that, in a fine MISFET, the electric field in the lateral direction is intensified in general across the junction between the drain region and the channel region so as to generate carriers having a high energy level. In many cases, the carriers thus generated are injected into the insulating film. As a result, some portions where carriers are likely to be trapped are formed in the insulating film. Also, interface states at which the carriers are likely to be trapped are generated on the interface between the semiconductor substrate and the insulating film. It follows that the element is rendered unsatisfactory in terms of reliability of operation. For overcoming the difficulty, proposed is an FET structure achieved by improving the impurity profile in the drain region, so called the LDD (Lightly Doped Drain) structure. As a matter of fact, the particular FET structure is actually employed in a MISFET.

FIG. 15 shows a cross section of a conventional MISFET employing the LDD structure noted above. As shown in the drawing, an n+-type source region 162a and an n+-type drain region 162b are formed in the surface region of a p-type silicon substrate 161. Also, n-type regions 163a, 163b having an impurity concentration lower than that in the source and drain regions 162a, 162b are formed in the surface region of the substrate 161 between and in direct contact with the source and drain regions 162a, 162b, respectively, such that these n-type regions 163a, 163b are apart from each other. A channel region 164 is interposed between the n-type regions 163a and 163b. Further, a gate insulating film 165 is formed on the channel region, and a gate electrode 166 is formed on the gate insulating film 165. It should also be noted that side walls 167a, 167b are formed on the side of the source region and the drain region, respectively, in a manner to cover the side surfaces of the gate insulating film 165 and the gate electrode 166. Also, electrode wirings 168a, 168b are connected to the source region 162a and the drain region 162b, respectively. Further, the clearances between the electrode wirings 168a, 168b and the side walls 167a, 167b of the source and drain regions are completely filled with an insulating layer 169. As apparent from the drawing, the insulating layer 169 extends to cover the upper surface of the gate electrode 166.

It is important to note that the n-type region 163a, 163b are included in the MISFET of the construction shown in FIG. 15. As a result, the depletion layer is expanded during the operation of the element, making it possible to moderate the electric field applied to the particular region. However, the MISFET employing the LDD structure gives rise to another problem. Specifically, the impurity concentration of the n-type region 163a, 163b formed in direct contact with the source and drain region 162a, 162b is so low and is not controlled by the gate electrode 166. As a result, a parasitic resistance is increased, leading to a diminished drivability. If the side walls 167a, 167b of the gate structure are formed of a material having a dielectric constant higher than that of the gate insulating film 165 in an attempt to improve the control capability of the gate electrode, however, the electric field strength is promoted in the lower corner portion 166a of the gate electrode 166, resulting in reduction in the gate breakdown voltage As described above, a strong electric field is applied to the lower corner portion of the gate electrode in the conventional semiconductor device, e.g., MISFET, of a high integration density, leading to reduction in the gate breakdown voltage and, further, to insulation breakdown. In the technique intended to overcome the above-noted difficulty, the control capability of the gate electrode is impaired.

SUMMARY OF THE INVENTION

The present invention, which has been achieved in view of the situation described above, is intended to provide a semiconductor device which has a high gate breakdown voltage and permits the gate electrode to per form its controlling function satisfactorily.

According to a first aspect of the present invention, there is provided a semiconductor device, comprising:

a semiconductor substrate;

an electrode formed above the substrate, said electrode having corner portion facing the substrate and side wall portion contiguous to the corner portion; and a laminate structure positioned between the substrate and the electrode and formed of an n-number of insulating film means consisting of first insulating film means near the substrate to n-th insulating film means near the electrode, said laminate structure extending to cross a straight line joining the substrate and the corner portion of the electrode, and the values of the dielectric constant of the laminated insulating film means progressively increasing with increase in the laminated order of the insulating film means.

It is desirable for the lower surface of the electrode to be parallel with the substrate surface, though it is acceptable for the lower surface of the electrode to be inclined upward or downward to make an angle of 15° or less with the substrate surface. Likewise, it is desirable for the side wall portion of the electrode to be perpendicular to the substrate surface, though it is acceptable for the side wall portion of the electrode to be inclined to the right or to the left to make an angle of 15° or less with a plane perpendicular to the substrate surface. If the lower surface or the side wall portion of the electrode is further inclined, the electrode fails to perform its proper function as a MIS type electrode.

It should be noted that a strong electric field is applied to the corner portions of the electrode, with the result that a leak current tends to flow through the straight line joining the corner portion of the electrode and the substrate. On the other hand, it is desirable for the laminate structure to consist of a larger number of insulating film means in view of the effect of moderating the electric field applied between the corner portion of the electrode and the substrate. However, it is difficult to manufacture the laminate structure consisting of a large number of insulating film means. In practice, it is desirable for the laminate structure to consist of at most three insulating film means.

According to a second aspect of the present invention, there is provided a semiconductor device, comprising:

a semiconductor substrate;

an electrode formed above the substrate, said electrode having corner portion facing the substrate and said wall portion contiguous to the corner portion;

first insulating film means formed between the substrate and the electrode; and side wall insulating film means formed to cover the side wall portion of the electrode and having an extended portion positioned between the electrode and the first insulating film means in a manner to surround the corner portion of the electrode, the dielectric constant of the side wall insulating film means being larger than that of the first insulating film means.

According to a third aspect of the present invention, there is provided a semiconductor device, comprising:

a semiconductor substrate;

an electrode formed above the substrate, said electrode having corner portions facing the substrate and side wall portions contiguous to the corner portions at both sides;

first and second insulating film means formed between the substrate and the electrode in a manner to extend over the side wall portions of the electrode, said first insulating film means being positioned on the side of the substrate, with said second insulating film means being positioned on the side of the electrode, and the dielectric constant of the second insulating film means being larger than that of the first insulating film means.

In the semiconductor device according to the first aspect of the present invention described above, a laminate structure consisting of a plurality of insulating films differing from each other in the dielectric constant is interposed between the corner portion of the electrode and the substrate. It should be noted that the values of the dielectric constant of the laminated insulating films progressively increase with increase in the laminate order of the insulating film means, as counted from the insulating film nearest the substrate. In order words, the insulating film nearest the corner portion of the electrode has the largest dielectric constant. According to a physical theory on the assumption that the electric flux density is constant, the particular construction employed in the present invention permits moderating the electric field strength between the corner portion of the electrode and the substrate, compared with the case where insulating films having the same dielectric constant are interposed between the corner portion of the electrode and the substrate. To be more specific, it is possible to suppress at a low level the internal electric field of the insulating film in direct contact with the corner portion of the electrode in the case where the insulating film has a high dielectric constant. In general, the electric flux density D is given by: $D = \epsilon E$, where $\epsilon$ denotes the dielectric constant and E indicates the intensity of the electric field. In the case of the interface of two insulators which have unequal $\epsilon$, the electric field intensity E is determined so that the perpendicular part of the electric flux density D is continuous on the interface.

In the semiconductor device according to the second of the present invention described above, the semiconductor device comprises a MIS type electrode, a first insulating film means, and a side wall insulating film means. What should be noted is that the side wall insulating film means has an extended between the corner portion of the electrode and the first insulating film means. In addition, the side wall insulating film means has a dielectric constant larger than that of the first insulating film means. As described previously, the particular dielectric constant distribution permits the electric field intensity within the side wall insulating film means to be lower than that within the first insulating film means on the interface. As a result, it is possible to suppress the electric field strength on the corner portion of the electrode. It follows that in the case of, for example, a MIS type FET, it is possible to increase the gate breakdown voltage and, at the same time, to increase the electric field intensity within the source and drain regions so as to improve the control capability of the gate electrode.

In the semiconductor device according to the third aspect of the present invention described above, a laminate structure consisting of a plurality of insulating films differing from each other in the dielectric constant is interposed between the electrode and the substrate. What should be noted is that the interface between adjacent insulating films does not extend in a direction perpendicular to the substrate surface. It follows that a leak current flowing along the interface noted above need not be worried about in the present invention, leading to a further improvement in the breakdown voltage.

Additional objects and advantages of the invention will be set forth in the description which follows, and in part will be obvious from the description, or may be learned by practice of the invention. The objects an advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIGS. 2A to 2F are cross sectional views showing the steps for manufacturing the semiconductor device shown in FIG. 1;

FIGS. 4A to 4E are cross sectional views showing the steps for manufacturing an n-channel MISFET, i.e., a semiconductor device according to a second embodiment of the present invention;

FIG. 5 is a cross sectional view showing the construction of a MIS type capacitor, i.e., a semiconductor device according to a third embodiment of the present invention;

FIG. 6 is a cross sectional view showing the construction of an n-channel type MISFET, i.e., a semiconductor device according to a fourth embodiment of the present invention;

DETAILED DESCRIPTION OF THE PREFERRED EMBODIMENTS

Figure 1:
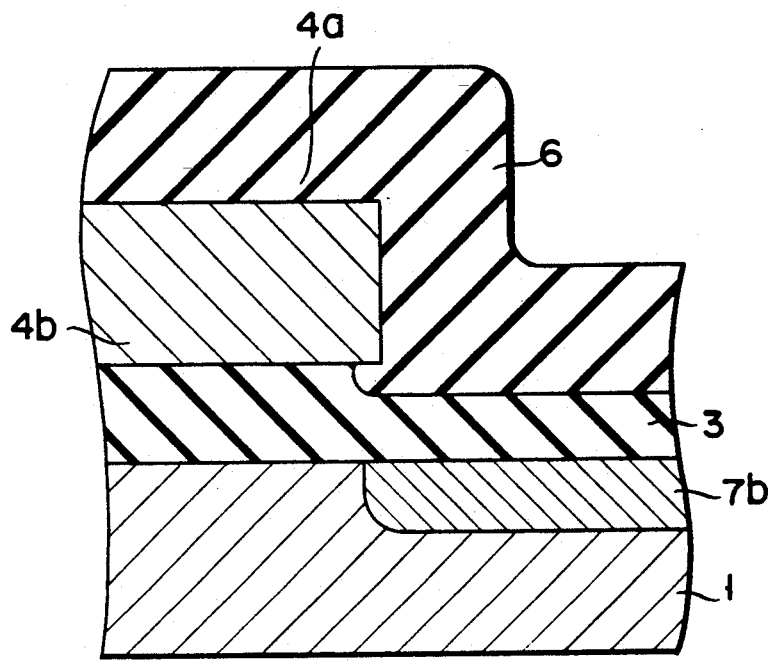
FIG. 1 is a cross sectional view showing in a magnified fashion a region around the lower corner portion of a gate electrode included in an n-channel type MISFET, i.e., a semiconductor device according to a first embodiment of the present invention.
Figure 2A:
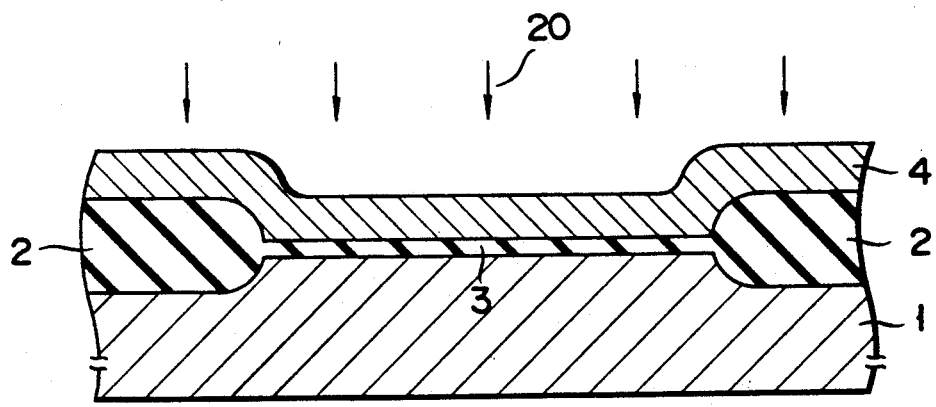

The semiconductor device according to the first embodiment of the present invention, which is shown in FIG. 1, is manufactured by the steps shown in FIGS. 2A to 2F. In the first step, a field insulating film 2 for element isolation is selectively formed on the surface of a p-type semiconductor substrate 1, as shown in FIG. 2A. Alternatively, the field insulating film 2 may be formed on a p-type well region (not shown) formed i the surface region of an n-type semiconductor substrate (not shown). After formation of the field insulating film 2, thin thermal silicon dioxide film 3 acting as a first insulating film (or a gate oxide film) is formed on the surface of the substrate 1 in an element region surrounded by the field oxide film 2. The thermal oxide film 3, which has a thickness of 7 nm, is formed under heating by means of oxidation with a diluted hydrochloric acid. Further, a polycrystalline silicon film 4 is deposited in a thickness of about 400 nm on the entire surface by means of LPCVD (low pressure chemical vapor deposition), followed by implanting phosphorus ions 20 into the polycrystalline silicon film 4 with a does of $2 \times 10^{15}$ cm$^{-2}$ under an accelerating energy of 30 KeV so as to enable the polycrystalline silicon film 4 to exhibit an n+-type conductivity.

In the next step, a resist pattern 5 is formed by patterning a resist layer (not shown), as shown in FIG. 2B. Then, an anisotropic etching is applied to the polycrystalline silicon film 4 with the resist pattern 5 used as a mask so as to selectively remove the polycrystalline silicon film 4 and, thus, to form an n+-type gate electrode 4a having a gate length of 0.5 μm or less, as shown in FIG. 2C.

After formation of the gate electrode 4a, the resist pattern 5 is removed. Then, an n+-type source region 7a and an n+-type drain region 7b are formed in a self-aligned fashion with the n+-type gate electrode 4a used as a mask by implanting an impurity, e.g., arsenic ions 43, with a does of $5 \times 10^{15}$ cm$^{-2}$ under an accelerating energy of 40 KeV. It is followed by applying, for example, a dry etching treatment so as to remove the gate oxide film 3 in the portion right under the lower corner portion 4b of the gate electrode 4a, as shown in FIG. 2D. As seen from the drawing, the lower corner portion of the electrode 4a is exposed to the outside in this step.

Figure 2E:
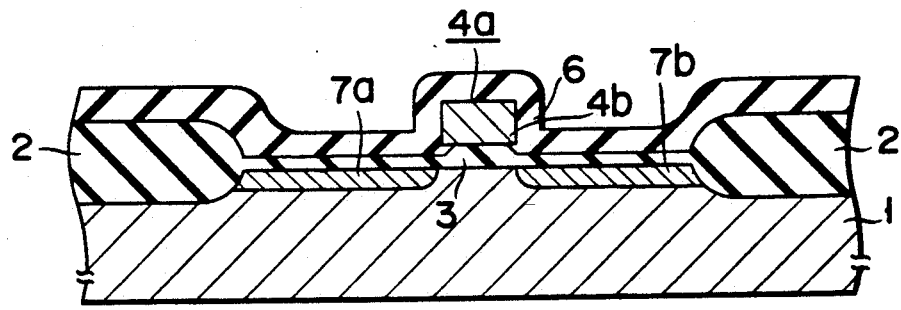

Further, a silicon nitride film 6 acting as a second insulating film is deposited on the entire surface by means of LPCVD so as to cover the lower corner portion 4b of the gate electrode 4a with the silicon nitride film 6, as shown in FIG. 2E.

Figure 2F:
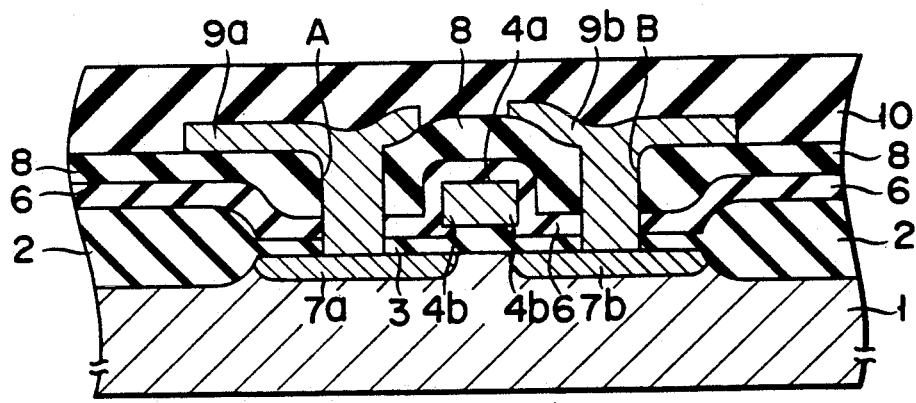

In the next step, as shown in FIG. 2F, an interlayer insulating film 8 such as a silicon dioxide film, a PSG film or a BPSG film, is formed by means of CVD. Finally, opening A and B are formed in a manner to expose the source region 7a and the drain region 7b. Naturally, these opening A and B are filled in the subsequent step with electrode wirings 9a, 9b, respectively, followed by forming a protective film 10 on the entire surface, so as to form the n-channel type MOSFET shown in FIG. 1 as a semiconductor device according to the first embodiment of the present invention. As shown in FIG. 1, the lower corner portion 4b of the gate electrode 4a is covered with the silicon nitride film 6 having a dielectric constant of 7.5, which is larger than the dielectric constant ($\epsilon = 3.9$) of silicon dioxide forming the gate oxide film.

Figure 3:
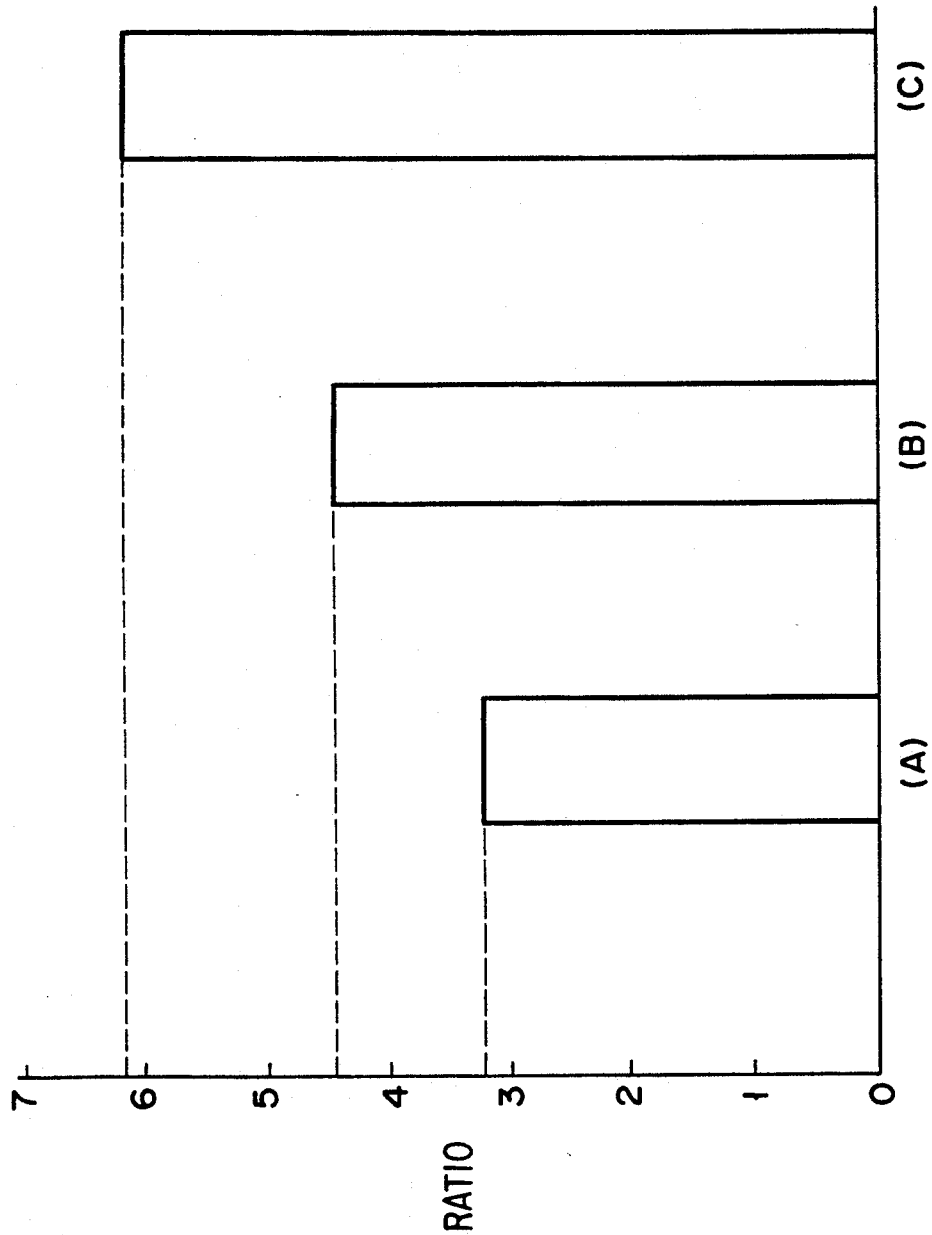
FIG. 3 is a graph showing the relative intensity of the electric field in the lower corner portion of the gate electrode, with respect to the n-channel MISFET of the present invention shown, in FIG. 1 and a plurality of conventional n-channel MOSFET's.

The intensity of electric field at the lower corner portion of the gate electrode was measured with respect to an n-channel type MOSFET (A) according to the present invention, a conventional n-channel type MOSFET (B) in which the insulating film interposed between the gate electrode and the source (drain) region is formed of silicon dioxide alone, and a conventional n-channel type MOSFET (C) in which the side wall of the gate electrode is covered with a silicon nitride film. FIG. 3 shows the results in terms of a ratio of the electric field intensity at the lower corner portion of the gate electrode to the electric field intensity in the central portion of the gate electrode. As seen from the graph of FIG. 3, the ratio is increased stepwise in the order of sample A, B and C. To be more specific, the electric field intensity at the lower corner portion in sample A (present invention) was found to be lower by 27% than that in sample B. In other words, the particular construction of the present invention makes it possible to increase the gate breakdown voltage. Also, the technical idea of the present invention permits increasing the electric field intensity at the source region 7a and the drain region 7b so as to improve the control capability of the gate.

FIGS. 4A to 4E collectively show a method of manufacturing a semiconductor device according to a second embodiment of the present invention. The reference numerals shown in FIGS. 4A to 4E, which are common with those put in FIGS. 1 and 2A to 2F, denote the same members of the device and, thus, a detailed description thereof is omitted in the following description of the second embodiment of the present invention.

Figure 4A:
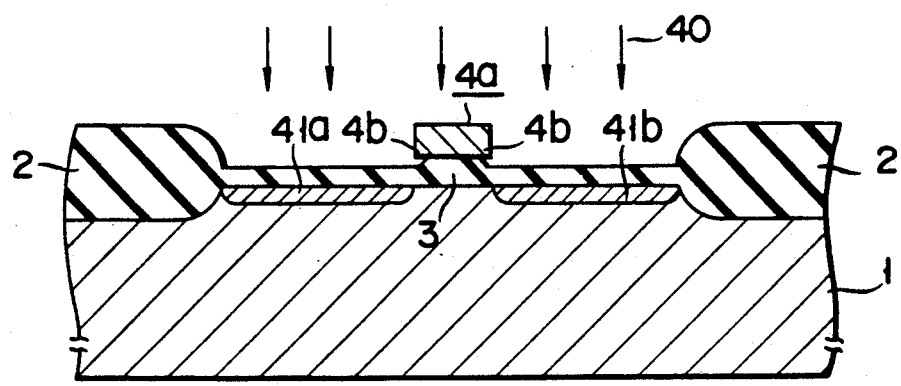
Figure 4B:
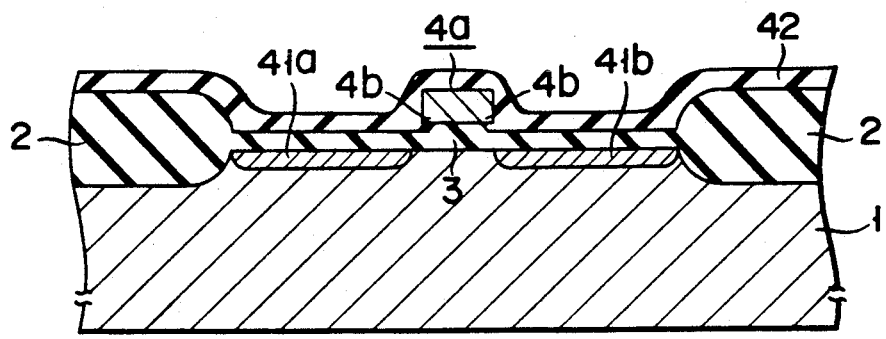

The steps shown in FIGS. 2A to 2D, which are employed in the first embodiment described previously, are followed in the second embodiment, too. Then, an impurity, e.g., phosphorus ions 40, is implanted into the surface region of the substrate with the gate electrode 4a used as a mask so as to form an n-type source region 41a and an n-type drain region 41b, as shown in FIG. 4A. The ion implantation is carried out at a does of $1 \times 10^{13}$ cm$^{-3}$ and under an accelerating energy of 20 KeV. After formation of the source and drain regions, a silicon nitride film 42 is deposited by means of CVD (chemical vapor deposition) such that the lower corner portion 4b of the gate electrode 4a is covered with the silicon nitride film 42, as shown in FIG. 4B.

Figure 4C:
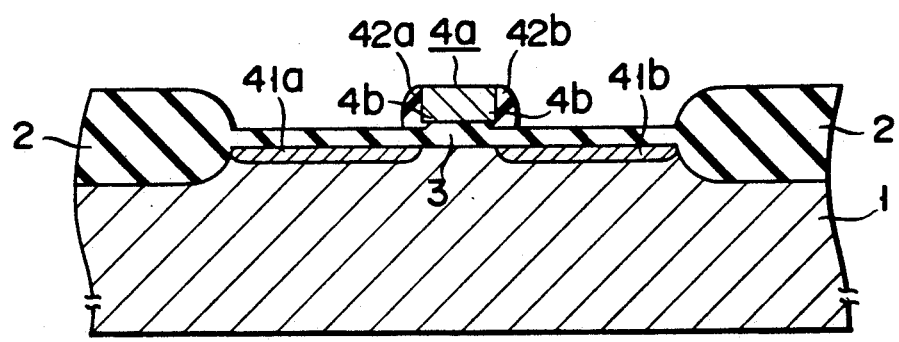

In the next step, an anisotropic etching is applied to the silicon nitride film so as to form side walls 42a, 42b covering the side surfaces of the gate electrode 4a, as shown in FIG. 4C. The side wall thus formed acts as a second insulating film. Then, an impurity, e.g., arsenic ions 43, is implanted into the surface region of the substrate 1 by means of ion implantation so as to form n-type regions 44a, 44b of a high impurity concentration, as shown in FIG. 4D. It should be noted that these n-type regions 44a, 44b overlap with the source region 41a and the drain region 41b, respectively. In this step, the ion implantation is carried out by using as a mask the gate electrode 4a and the side walls 42a, 42b with a does of $5 \times 10^{15}$ cm$^{-3}$ and under an accelerating energy of 40 KeV.

Finally, an interlayer insulating film 45, electrode wirings 9a, 9b and a protective film 10 are formed as described previously in conjunction with FIG. 2F, as shown in FIG. 4E so as to manufacture a semiconductor device according to the second embodiment of the present invention.

The semiconductor device according to the second embodiment of the present invention produces the effect similar to that produced by the first embodiment described previously. It should be noted in particular that, in the second embodiment, it is possible to increase the electric field intensity in the n-type source and drain regions 41a, 41b of a low impurity concentration, making it possible to improve the control capability of the gate and, thus, to increase the drivability of a transistor.

Each of the first and second embodiments described above is directed to an n-channel type MOSFET. However, it is also possible to provide a p-channel type MOSFET of the similar construction by changing the kind of the impurity determining the conductivity type of the semiconductor layer. Also, where the gate is sufficiently long, it is possible to apply an annealing treatment under an oxidizing atmosphere after formation of the gate electrode so as to achieve growth of the oxide film positioned right under the lower corner portion of the gate electrode and, thus, to improve the gate breakdown voltage.

FIG. 5 is a cross sectional view showing the construction of a MOS type capacitor, i.e., a semiconductor device according to a third embodiment of the present invention. As seen from the drawing, a first insulating film, e.g., a silicon oxide film 48h, is formed on the surface of an n-type (or p- or i-type) semiconductor substrate 48a, and a conductive layer acting as an electrode, e.g., a polycrystalline silicon layer 48c, is formed on the first insulating film 48b. It should be noted that the lower corner portion 48d of the polycrystalline silicon layer 48c is not in contact with the silicon oxide film 48b. Further, a second insulating film, e.g., a silicon nitride film 48e, is formed to fill the clearance between the lower corner portion 48d of the polycrystalline silicon layer 48c and the silicon oxide film 48b. On the other hand, an electrode 48f is formed on the back surface of the substrate 48a. Further, input/output wirings 48g and 48h are connected to the polycrystalline silicon film 48c and the electrode 48f, respectively.

It should be noted that, in the MOS type capacitor of the construction described above, the silicon nitride film 48e has a dielectric constant larger than that of the silicon oxide film 48b, making it possible to suppress the electric field concentration at the corner portion 48d of the film 48c and, thus, to improve the withstand voltage of the MOS type capacitor.

The technical idea of the present invention can be applied to various other kinds of semiconductor devices including, for example, a MOS type diode and a MOS type power transistor.

In the present invention, it is important for the second insulating film to have a dielectric constant larger than that of the first insulating film. As far as the particular condition is satisfied, various combinations of insulating films other than those described previously can be employed in the present invention. For example, it is possible for the insulating films to be formed of oxides such as $Ta_2O_5$ having a dielectric constant $\epsilon$ of 20 or more and $Al_2O_3$ having dielectric constant $\epsilon$ of 9.3 or nitrides such as aluminum nitride.

In the embodiments described previously, the conductive layer is provided by an n-type or p-type semiconductor layer. However, the semiconductor layer can be replaced by, for example, a metal or a metal-semiconductor alloy, as far as the conductive layer exhibits a low resistivity so as to permit a sufficient flow of an electric current. The device comprising the particular conductive layer includes, for example, an FET which does not comprise source and drain regions and the source and drain electrodes also perform the functions of the source and drain regions. In any of the embodiments described previously, the corner portion of the electrode facing the semiconductor substrate has an angle of 90°. However, it is not absolutely necessary for the corner portion to have an angle of 90°. To be more specific, it is possible for the angle of the corner portion to fall within a range of between 0° and 180° in view of the particular effect produced by the present invention. In other words, the particular construction of the present invention is effective in the cases where the lower corner portion of the electrode facing the substrate is shaped such that electric field is likely to be concentrated thereon.

Figure 8A:
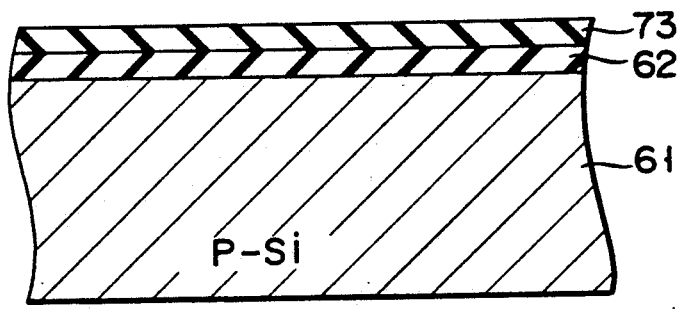
FIGS. 8A to 8C are cross sectional views showing the steps for manufacturing a semiconductor device according to a fourth embodiment of the present invention.
Figure 8B:
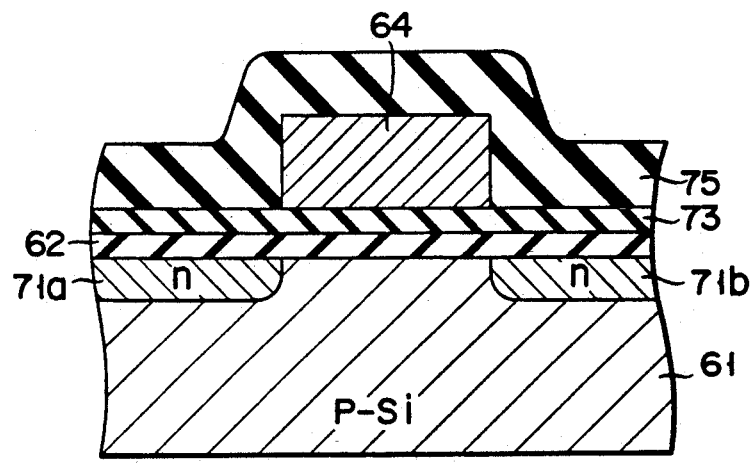
Figure 8C:
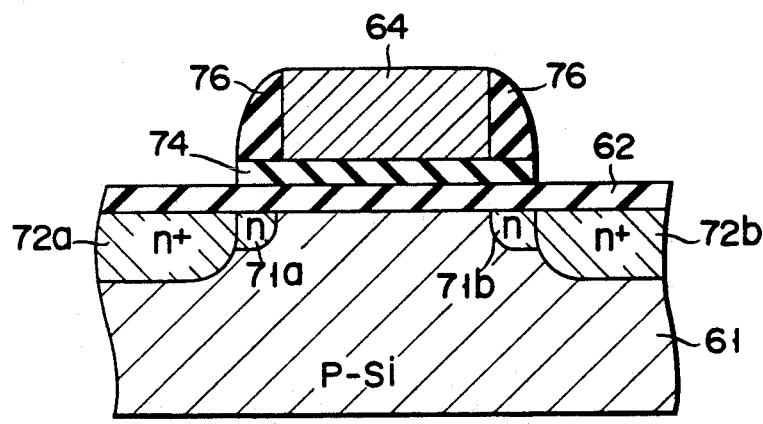

FIG. 6 shows a semiconductor device according to a fourth embodiment of the present invention, with FIGS. 8A to 8C showing how to manufacture the semiconductor device shown in FIG. 6.

For manufacturing the semiconductor device shown in FIG. 6, thermal oxide film 62 having a thickness of 10 nm is formed first as a first gate insulating film on the surface of a p-type semiconductor substrate 61, as shown in FIG. 8A. Then, a nitriding treatment is applied under an ammonia gas atmosphere to a surface region of the thermal oxide film 62 so as to form a silicon nitride film 73 acting as a second gate insulating film on the thermal oxide film 62.

In the next step, a polycrystalline silicon film is deposited on the entire surface, followed by patterning the polycrystalline silicon film by a known patterning technique so as to form a gate electrode 64, as shown in FIG. 8B. After formation of the gate electrode 64, n-type lightly doped regions 71a, 72b are formed in a self-aligned fashion by the known ion implantation technique using the gate electrode 64 as a mask, followed by depositing a silicon nitride film 75 on the entire surface by the LPCVD method.

The silicon nitride film 75 is then subjected to the known RIE method so as to permit the silicon nitride film to be left unremoved selectively such that the remaining silicon nitride forms a silicon nitride film 76 in a manner to cover the side surface of the gate electrode 64, as shown in FIG. 8C. Then, n+-type source region 72a and drain region 72b are formed in a surface region of the substrate 61 by means of the known ion implantation technique using the gate electrode 64 and the silicon nitride film 76 as a mask.

After formation of the source and drain regions, an interlayer insulating film (not shown) consisting of, for example, a CVD-$SiO_2$ is formed on the entire surface. Further, contact holes (not shown) are made in the thermal oxide film 62 so as to exposed the source and drain regions 72a, 72b, followed by forming a source electrode and a drain electrode within the contact holes. Finally, wiring layers connected to these electrodes are formed as desired on the interlayer insulating film so as to manufacture an n-channel type MOSFET as shown in FIG. 6, i.e., a semiconductor device according to the fourth embodiment of the present invention.

Figure 7:
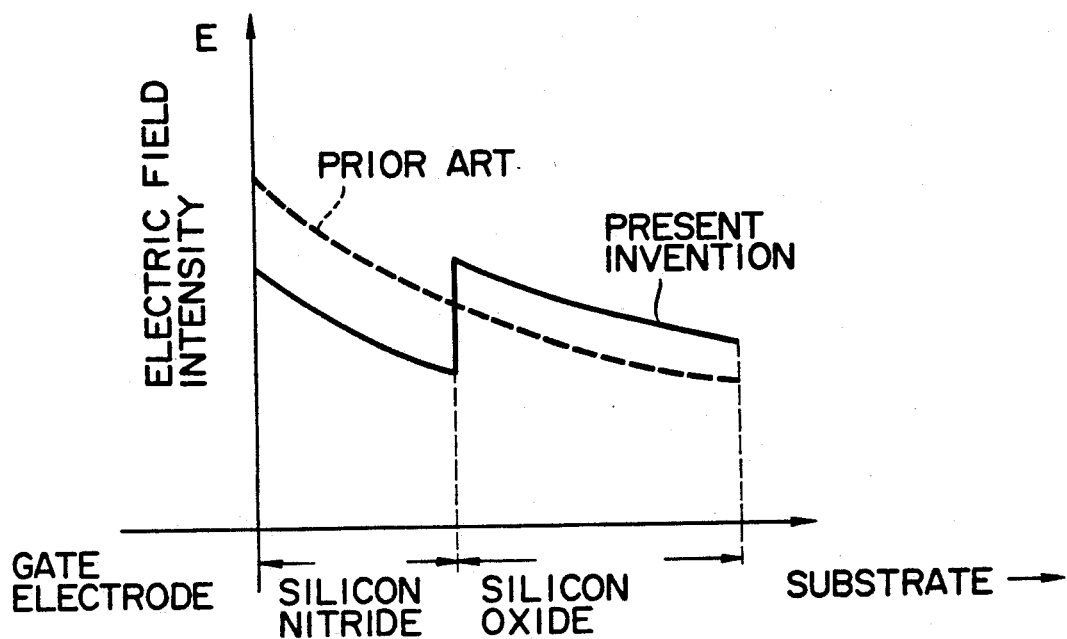
FIG. 7 is a graph showing the electric field intensity in the cross section along the line VII—VII shown in FIG. 6.

The MOSFET shown in FIG. 6 is of an LDD structure, which comprises the lightly doped regions 71a, 71b. It should be noted that the lower surface and the side surface of the gate electrode 64 are surrounded by the silicon nitride films 74 and 76 having a dielectric constant $\epsilon$ of 7.5, which is larger than the dielectric constant ($\epsilon = 3.9$) of the silicon oxide film 62. FIG. 7 shows an electric field intensity across a cross section of the MOSFET along the line VII—VII shown in FIG. 6. As apparent from the graph of FIG. 7, the device according to the fourth embodiment of the present invention permits reducing the electric field intensity to 1/1.4, compared with the conventional device in which the gate insulating film is formed of silicon oxide alone.

It be noted in this connected that the gate insulating film used in the MOSFET of the fourth embodiment described above is of two-layer structure consisting of materials having different dielectric constants. To be more specific, the gate insulating film consists of the thermal oxide film 62 and the silicon nitride film 74. What is important is that the silicon nitride film 74 in direct contact with the gate electrode 64 has a dielectric constant larger than that of the thermal oxide film 62 in direct contact with the substrate 61. As pointed out previously, the electric flux density D is given by: $D = \epsilon E$, where s denotes the dielectric constant, and E represents the electric field intensity. The electric flux density D becomes continuous in the vertical direction at the interface between two different media, making it possible to set the electric field intensity E at a low level by increasing the dielectric constant $\epsilon$ in the vicinity of the gate electrode.

Figure 14:
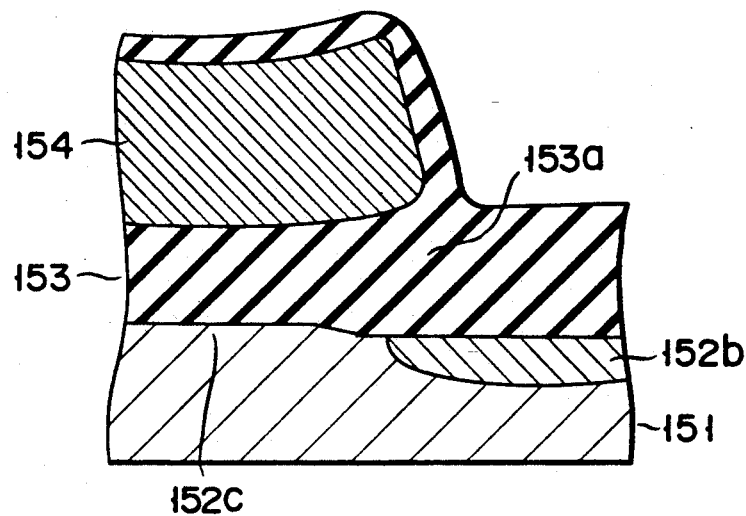
FIG. 14 is a cross sectional view showing a region around the lower corner portion of a gate electrode included in a MISFET in which a conventional technique is employed for preventing reduction in the gate breakdown voltage.
Figure 15:
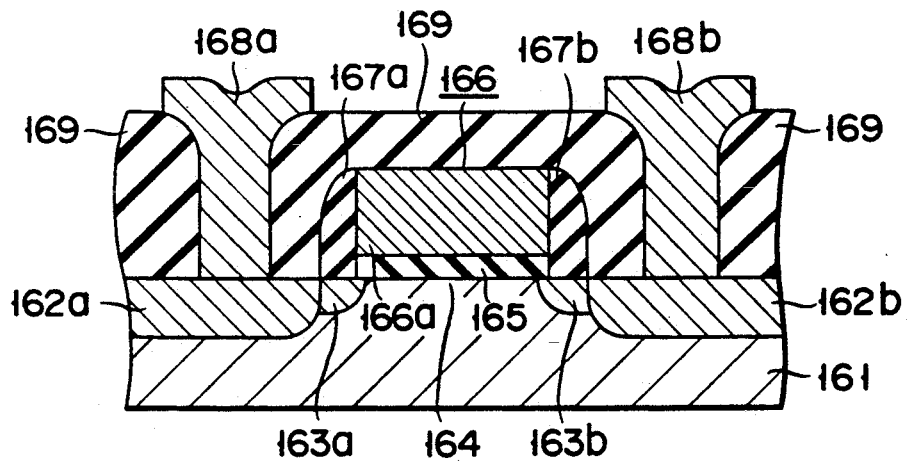
FIG. 15 is a cross sectional view showing the conventional LDD structure.

It should also be noted that the step of growing an oxide film as in the conventional technique shown in FIG. 14 is not employed in this embodiment, with the result that the thickness of the gate insulating film can be controlled very accurately. In addition, where the FET is of an LDD structure, it is possible to apply an electric field of a sufficiently high intensity even from the lower corner portion of the gate electrode 64 to the n-type regions 71a and 71b of a low impurity concentration so as to generate a greater number of carriers. It follows that the resistance between the n+-type source and drain regions 71b and 71b can be lowered so as to improve the mutual conductance of the FET. What should also be noted is that each of the silicon oxide film 62 and the silicon nitride film 74 extends over the entire lower surface region of the gate electrode 64. In other words, a cutting line of the silicon oxide film 62 o the silicon nitride film 74 is not positioned below the gate electrode 64. It follows that a leak current flowing along the cutting line between the electrode and the substrate need not be worried about. It follows that it is possible to increase the breakdown voltage and thus a high reliability.

In the embodiment shown in FIG. 6, the silicon nitride film 75 was deposited in the step shown in FIG. 8a after formation of the gate electrode 64 without etching the silicon nitride film 73 formed on the oxide film 62. However, it is also possible to remove the exposed portion of the silicon nitride film 73 by etching before the deposition of the silicon nitride film 75.

Figure 9:
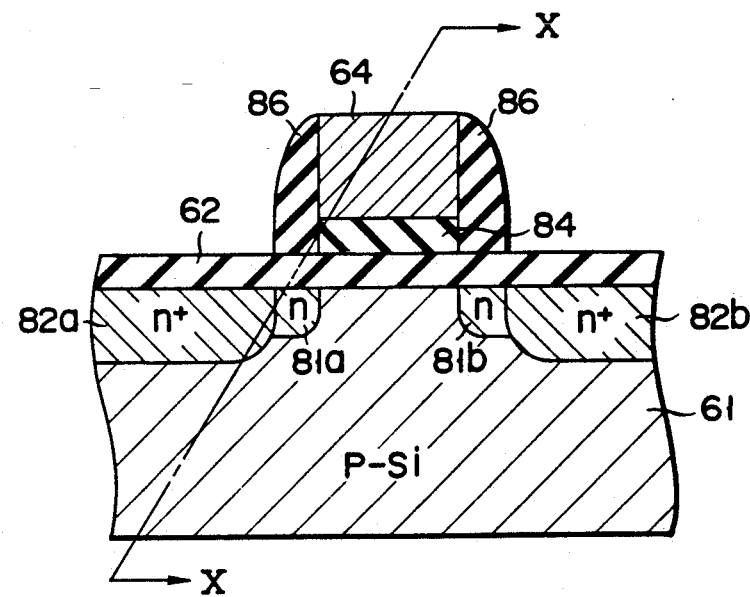
FIG. 9 is a cross sectional view showing an n-channel MISFET, i.e., a semiconductor device according to a fifth embodiment of the present invention.
Figure 11A:
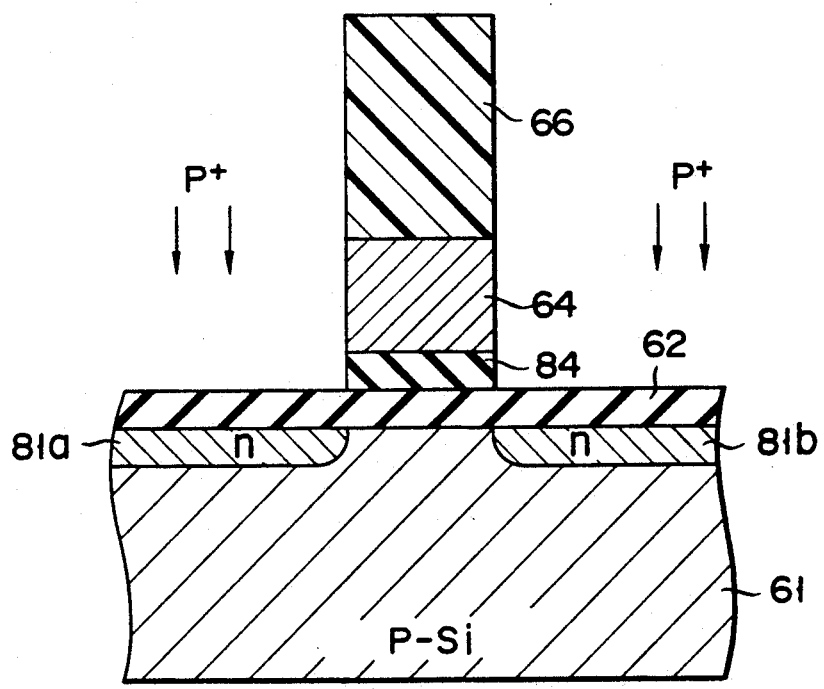
FIGS. 11A to 11C are cross sectional views showing the steps for manufacturing a semiconductor device according to a fifth embodiment of the present invention.
Figure 11B:
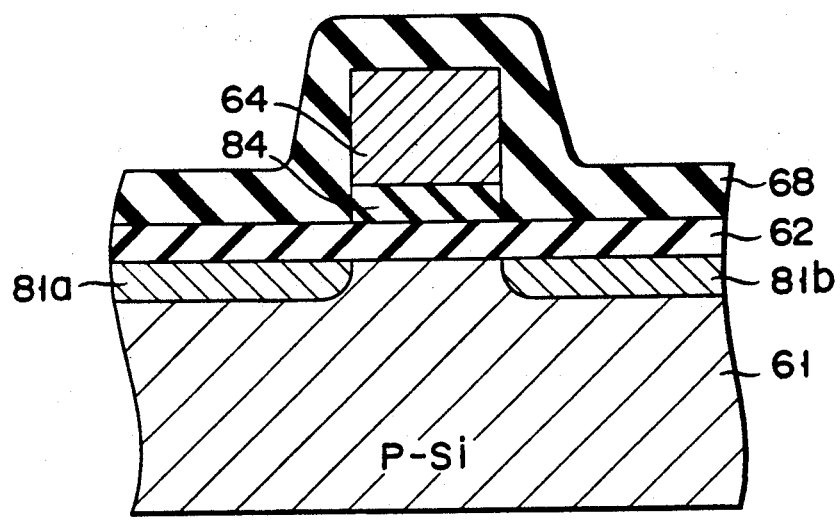
Figure 11C:
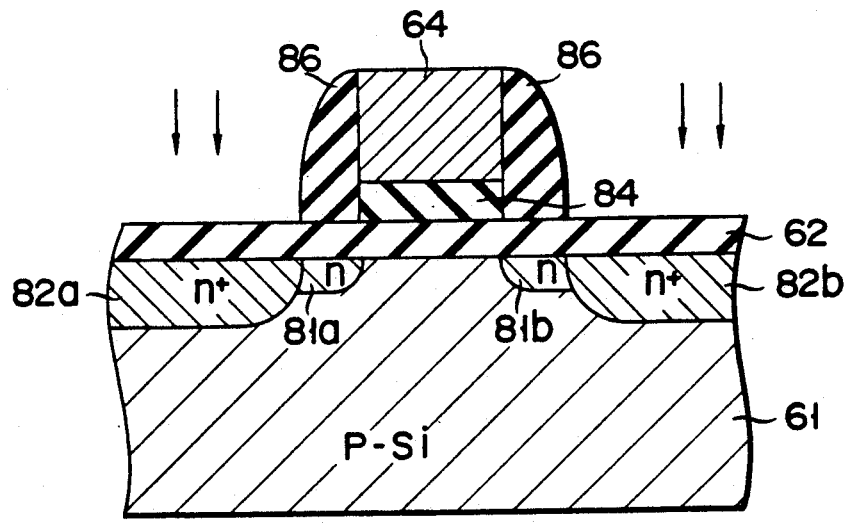

FIG. 9 shows a semiconductor device according to a fifth embodiment of the present invention, with FIGS. 11A to 11C showing how to manufacture the semiconductor device shown in FIG. 9. Incidentally, the reference numerals common with FIGS. 8A to 8C and FIGS. 11A to 11C denote the same members of the and, thus, the detailed description thereof is omitted in the following description of the fifth embodiment.

For manufacturing the semiconductor device shown i FIG. 9, a silicon thermal oxide film 62 is formed in a thickness of 10 nm on the surface of a p-type semiconductor substrate 61, as shown in FIG. 11A. The thermal oxide film 62 acts as a first gate insulating film. Then, a tantalum oxide film 84 acting as a second gate insulating film is formed on the thermal oxide film 62 by means of CVD, followed by successively depositing a polycrystalline silicon film, which is patterned later into a gate electrode 64, and a resist film 66 on the polycrystalline silicon film 64. Further, the resist film 66 is patterned and, then, the polycrystalline silicon film is etched with the resist pattern 66 used as a mask so as to form a gate electrode 64, followed by patterning the second gate insulating film of the tantalum oxide film 84 by the known RIE technique, with the gate electrode 64 used as a mask. Further, n-type regions 81a, 81b having a low impurity concentration are formed in the surface region of the substrate 61 by means of ion implantation of phosphorus with a does $1 \times 10^{13}$ cm$^{-2}$ and under an accelerating energy of 20 KeV, followed by removing the resist pattern 66 used in the previous patterning step. The impurity concentration of the n-type regions 81a, 81b is lower than that of n+-type source and drain regions referred to later. However, these regions 81a, 81b are capable of performing the functions of the source and drain regions. This is also the case with the embodiment shown in FIG. 4B and in a sixth embodiment which will be described later.

In the next step, a silicon nitride film 68 is deposited on the entire surface by means of LPCVD, as shown in FIG. 11B, followed by applying an anisotropic etching by RIE to the silicon nitride film 68 such that the silicon nitride film is selectively left unremoved so as to form a silicon nitride film 86 to cover the side surface of the gate electrode 64 and the second gate insulating film 84, as shown in FIG. 11C. Further, n+-type source and drain regions 82a, 82h are formed in a surface region of the silicon substrate by the known ion implantation technique using the gate electrode 64 and the side wall insulating film 86 as a mask, so as to form an n-channel type MISFET as shown in FIG. 9, i.e., a semiconductor device according to the fifth embodiment of the present invention.

The fifth embodiment described above produces effects similar to those produced by the fourth embodiment described previously. Further, the semiconductor device of the fifth embodiment produces an additional effect. It should be noted that the gate electrode 6 shown in FIG. 9 is surrounded by the second gate insulating film 84 formed of tantalum oxide having a dielectric constant $\epsilon 3$ of 20 or more and by the side wall insulating film 86 formed of silicon nitride having a dielectric constant $\epsilon 2$ of 7.5. What should be noted is that each of those tantalum oxide film and the silicon nitride film has a dielectric constant larger than that of the first gate insulating film 62 formed of silicon oxide having a dielectric constant $\epsilon 1$ of 3.9. As a result, it is possible to moderate the electric field intensity at the lower corner portion of the gate electrode and to enable the gate electrode to control the n-type regions of the low impurity concentration more effectively.

Figure 10:
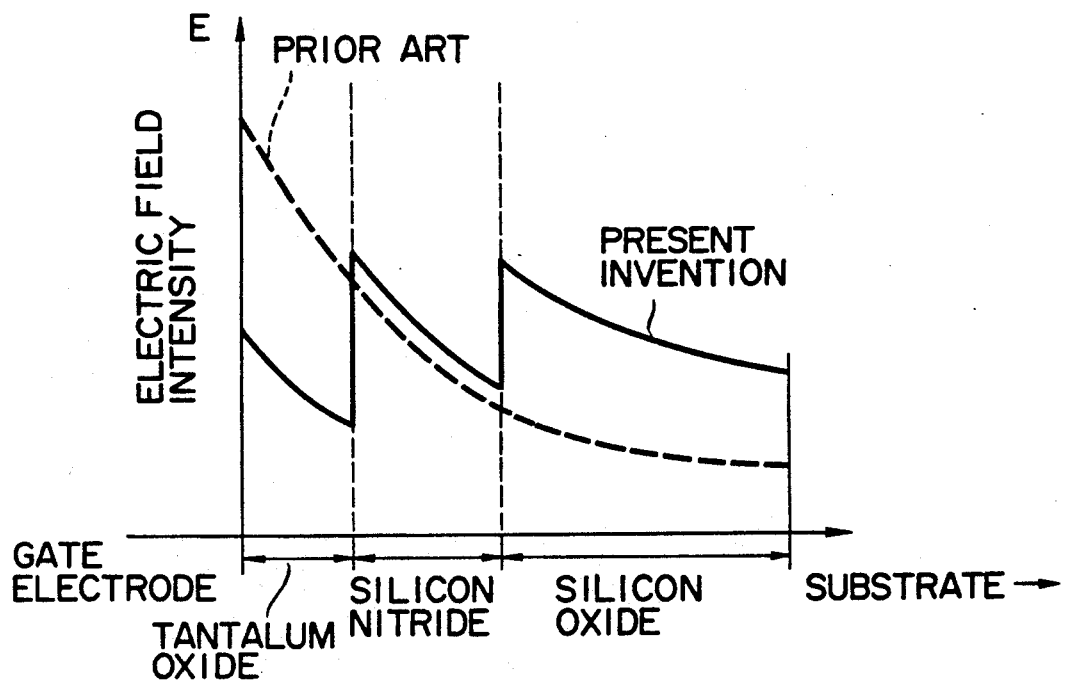
FIG. 10 is a graph showing the electric field intensity in the cross section along the line X—X shown in FIG. 9.

To be more specific, FIG. 10 shows the electric field intensity across a cross section of the MISFET shown in FIG. 9 along the line X—X shown in FIG. 9. As apparent from the graph of FIG. 10, the MISFET of the fifth embodiment permits lowering the electric field intensity to ½, compared with the prior art in which the gate insulating film is formed of silicon oxide alone.

Figure 12:
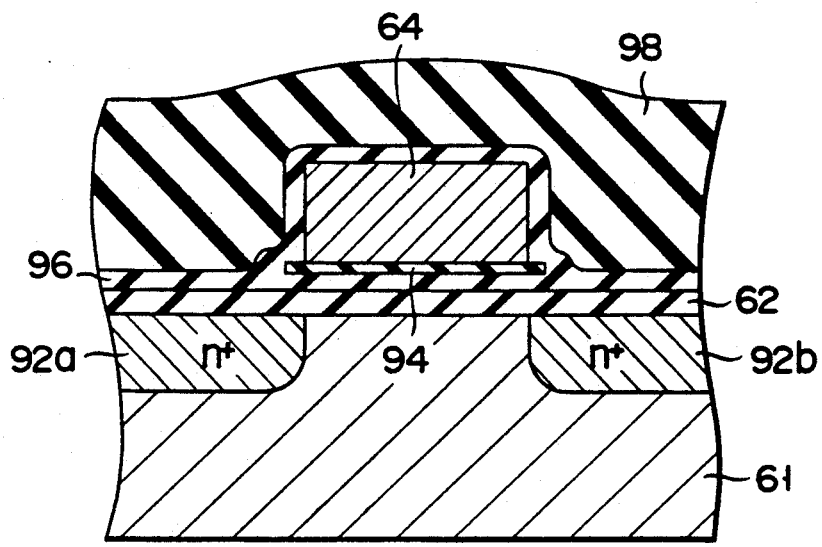
FIG. 12 is a cross sectional view showing an n-channel MISFET, i.e , a semiconductor device according to a sixth embodiment of the present invention.
Figure 13:
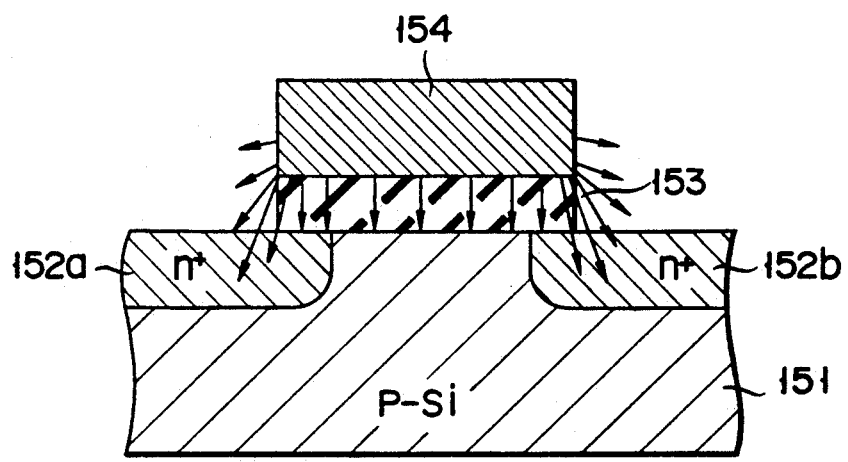
FIG. 13 is a cross sectional view showing the construction of a conventional n-channel MISFET and the distribution of lines of electric force in the conventional device.

FIG. 12 shows a cross section of a MISFET according to a sixth embodiment of the present invention. The sixth embodiment differs from the fifth embodiment in that the silicon nitride film used in the sixth embodiment is thinner than used in the fifth embodiment. Also, a silicon nitride film is interposed between the silicon oxide film 62 and the tantalum oxide film 94 in the sixth embodiment. Further, the south and drain regions 92a, 92b in the sixth embodiment are of n+-type having a high impurity concentration. Still further, the MISFET of the sixth embodiment comprises an interlayer insulating film 98 formed of silicon dioxide. The sixth embodiment of the particular construction permits producing the effects similar to those produced by the fifth embodiment. Incidentally, silicon nitride was tentatively used in place of silicon dioxide for forming the interlayer insulating film 98 in the six embodiment shown in FIG. 12. In other words, each of the interlayer insulating film 98 and the third gate insulating film 96 was formed of silicon nitride. In this case, the MISFET was found to produce effects similar to those produced by the first embodiment described previously.

It is possible to modify the semiconductor devices according to the fourth to sixth embodiments of the present invention described above as summarized below:

1. Where the gate is sufficiently long, it is possible to apply an annealing treatment under an oxidizing atmosphere after formation of the gate electrode so as to permit growth of the oxide film right under the lower corner portion of the gate electrode and, thus, to improve the gate breakdown voltage of the device.

2. The present invention is not restricted to a MISFET. It is possible to apply the technical idea of the present invention to various semiconductor devices having a MIS type electrode including, for example, a MIS type capacitor, a MIS type diode, and a MIS type power transistor.

3. The semiconductor substrate used in the present invention need not be restricted to a silicon substrate. It is also possible to us semiconductor substrates other than silicon substrate such as substrates of IV group semiconductors like germanium and diamond (C) and compound semiconductors like GaAs and InP. Further, it is possible to use SOI and SOS substrates which utilize a semiconductor layer formed on an insulating monocrystalline substrate or an insulating film.

4. It is possible to use in combination oxides such as $Ta_2O_5$ having a dielectric constant of 20 or more and $Al_2O_3$ having a dielectric constant of 9.3 and nitrides such as AlN a materials of the insulating films in addition to those used in the fourth to sixth embodiments described above 5. The material of the conductive electrode need not be restricted to aluminum. In addition to aluminum, it is possible to use a monocrystalline aluminum, aluminum based alloys such as Al-Si and Al-Si-Cu, metals having a high melting point and silicides thereof such as Mo, W, Ni, Co, Ti, molybdenum silicide, and tungsten silicide as a material of the conductive electrode. It is also possible to use other wiring materials such as copper and copper-based alloys. Further, an n-type or p-type polycrystalline silicon may be used as a material of the conductive electrode.

6. Each of the embodiments described above is directed to an n-channel type MISFET. However, it is possible to manufacture a p-channel type MISFET by exactly the same method by simply changing the conductivity type of the impurity.

Additional advantages and modifications will readily occur to those skilled in the art. Therefore, the invention in its broader aspects is not limited to the specific details, and representative devices, shown and described herein. Accordingly, various modifications may be made without departing from the spirit or scope of the general inventive concept as defined by the appended claims and their equivalents.

What is claimed is:

1. A semiconductor device, comprising:
    a semiconductor substrate;
    an electrode formed above the substrate, said electrode having a corner portion facing the substrate and a side surface contiguous to the corner portion; and
    a laminate structure positioned between the substrate and the electrode and formed of an n-number of insulating films consisting of a first insulating film near the substrate to an n-th insulating film near the electrode, said laminate structure extending to cross a straight line joining the substrate and the corner portion of the electrode, and the values of the dielectric constant of the laminated insulating film progressively increasing with increase in the laminated order of the insulating films;
    wherein said n-number is three or more, and said laminate structures includes at least three insulating films formed of silicon oxide, silicon nitride, and tantalum oxide, respectively, and arranged in this order from the substrate.

2. The semiconductor device according to claim 1, wherein said semiconductor device is a MISFET constructed such that source and drain regions are formed in a surface region of the substrate, said electrode acts as a gate electrode relative to said source and drain regions, and said first, laminate structure is positioned between the gate electrode and the source/drain regions.

3. A semiconductor device, comprising:
    a semiconductor substrate;
    an electrode formed above the substrate, said electrode having corner portion facing the substrate and said wall portion contiguous to the corner portion;
    first insulating film means formed between the substrate and the electrode; and
    side wall insulating film means formed to cover the side wall portion of the electrode and having an extended portion positioned between the electrode and the first insulating film means in a manner to surround the corner portion of the electrode, the dielectric constant of the side wall insulating film means being larger than that of the first insulating film means.

4. The semiconductor device according to claim 3, wherein said semiconductor device is a MISFET which is constructed such that source and drain regions are formed in a surface region of the substrate, said electrode acts as a gate electrode relative to the source and drain regions, and said first insulating film means is positioned between the gate electrode and the source/drain regions.

5. The semiconductor device according to claim 4, wherein said substrate is formed of silicon, said first insulating film means is formed of silicon oxide, and said side wall insulating film means is formed of silicon nitride.

6. The semiconductor device according to claim 3, wherein said semiconductor device is a MOS type capacitor, said electrode is formed of silicon, said first insulating film means is formed of silicon oxide, and said side wall insulating film means is formed of silicon nitride.

7. A semiconductor device, comprising:
    a semiconductor substrate;
    an electrode formed above the substrate, said electrode having corner portion facing the substrate and side surface contiguous to the corner portion;
    a first insulating film formed between the substrate and the electrode, and extending laterally beyond the side surface of the electrode;
    a second insulating film formed between the first insulating film and the electrode and in contact with the electrode, and having a side surface aligned with the side surface of the electrode;
    a side insulating film formed in contact with the side surfaces of the electrode and second insulating film;
    wherein said side insulating film has a dielectric constant smaller than that of the second insulating film, but larger than that of the first insulating film.

8. The semiconductor device according to claim 7, wherein said first insulating film is formed of silicon oxide, said second insulating film is formed of tantalum oxide, and each side insulating film is formed of silicon nitride.

9. The semiconductor device according to claim 7, wherein said semiconductor device is a MISFET constructed such that source and drain regions are formed in a surface region of the substrate, said electrode acts as a gate electrode relative to said source and drain regions, and said first and second insulating films are positioned between the gate electrode and the source/drain regions.

10. The semiconductor device according to claim 9, wherein said first insulating film is formed of silicon oxide, said second insulating film is formed of tantalum oxide, and said side insulating film is formed of silicon nitride.

* * * * *